United States Patent
Collins

(10) Patent No.: US 6,426,284 B1
(45) Date of Patent: Jul. 30, 2002

(54) METHOD OF MANUFACTURING WIRE BOND PAD

(75) Inventor: Peter Michael Frederick Collins, Mokena, IL (US)

(73) Assignee: Illinois Tool Works Inc., Glenview, IL (US)

( * ) Notice: Subject to any disclaimer, the term of this patent is extended or adjusted under 35 U.S.C. 154(b) by 0 days.

(21) Appl. No.: 09/531,349

(22) Filed: Mar. 20, 2000

(51) Int. Cl.⁷ .............................................. H01L 21/44
(52) U.S. Cl. ....................... 438/617; 438/618; 257/756
(58) Field of Search ............................... 257/784, 781, 257/774; 438/617, 618, 611, 612

(56) References Cited

U.S. PATENT DOCUMENTS

| | | |
|---|---|---|
| 4,970,106 A | 11/1990 | DiStefano et al. |
| 5,245,751 A | 9/1993 | Locke et al. |
| 5,320,864 A | 6/1994 | Rostoker |
| 5,329,695 A | 7/1994 | Traskos et al. |
| 5,342,999 A * | 8/1994 | Frei et al. ................. 174/266 |
| 5,378,313 A | 1/1995 | Pace |
| 5,436,062 A | 7/1995 | Schmidt et al. |
| 5,454,927 A | 10/1995 | Credle et al. |
| 5,455,460 A | 10/1995 | Hongo et al. |
| 5,463,191 A | 10/1995 | Bell et al. |
| 5,463,255 A | 10/1995 | Isono |
| 5,468,999 A | 11/1995 | Lin et al. |
| 5,495,667 A | 3/1996 | Farnworth et al. |
| 5,555,407 A | 9/1996 | Cloutier |
| 5,739,587 A * | 4/1998 | Sato ............................ 257/758 |
| 5,879,787 A | 3/1999 | Petefish |
| 5,939,775 A | 8/1999 | Bucci et al. |

* cited by examiner

Primary Examiner—David Nelms
Assistant Examiner—Dung A Le
(74) Attorney, Agent, or Firm—Mark W. Croll; Paul F. Donovan

(57) ABSTRACT

A wire bond pad in an electrical circuit device package and method therefor including forming an opening in a conductor of a first electrically conductive material, forming a conducting member of a second electrically conductive material, transferring the conducting member into the opening of the conductor, electrically contacting the conducting member with the conductor, and embedding conductor with the conducting member in the opening thereof in an insulating electrical circuit device package.

15 Claims, 2 Drawing Sheets

METHOD OF MANUFACTURING WIRE BOND PAD

BACKGROUND OF THE INVENTION

The invention relates generally to conductors having wire bond pads to which conductive leads of integrated circuit dice are connectable and methods therefor.

Wire bonding is a known technique for mounting electrical circuit devices, for example semiconductor integrated circuit dice, in electronic packaging. These circuit devices generally comprise a plurality of relatively small conductive leads that are electrically connected, for example by ultrasonic bonding, to wire bond pads of corresponding conductors embedded in the device package, which is usually a dielectric material. See generally U.S. Pat. No. 5,463,255 entitled "Semiconductor Integrated Circuit Device Having an Electrode Pad Including an Extended Wire Bonding Portion".

In some applications, the conductive leads or wires of the circuit devices are bonded to aluminum pads formed on corresponding conductors of the device package. In a known aluminium wire bond pad forming operation, a channel is formed in a strip of stock conductor material, for example a copper alloy, and a relatively thin strip of aluminum inlay is disposed in the channel. Thereafter, the conductor material with the aluminum inlay is reduced in a cold rolling operation to approximately one-half its original thickness. The conductor material with the inlayed aluminum strip is then cut into individual conductors strips, each of which includes an aluminum portion, which forms the wire bond pad. The aluminum inlay material used in known aluminum wire bond pad forming operations, however, is available from a limited supply and is very costly.

An object of the present invention is to provide novel wire bond pads and methods therefor the overcome problems in and improve upon the prior art.

Another object of the invention is to provide novel wire bond pads and methods therefor that are economical and reliable.

A further object of the invention is to provide novel wire bond pads and methods therefor that utilize reduced amounts of wire bond pad material.

Another object of the invention is to provide novel wire bond pads formed by conducting members disposed in openings of corresponding conductors embedded in an insulating member of a circuit device package.

A more particular object of the invention is to provide novel wire bond pads for electrical circuit device packages generally comprising a conductor of a first electrically conductive material embedded in an insulating member, preferably by insert molding, and a conducting member of a second electrically conductive material disposed in an opening of a portion of the conductor protruding into a device accommodating portion of the electrical circuit device package.

Another more particular object of the invention is to provide novel wire bond pad methods generally comprising forming an opening in a conductor of a first electrically conductive material, forming a conducting member of a second electrically conductive material, transferring the conducting member into the opening of the conductor, and electrically contacting the conducting member with the conductor.

These and other objects, aspects, features and advantages of the present invention will become more fully apparent upon careful consideration of the following Detailed Description of the Invention and the accompanying Drawings, which may be disproportionate for ease of understanding, wherein like structure and steps are referenced generally by corresponding numerals and indicators.

DETAILED DESCRIPTION OF THE INVENTION

Figure 1:
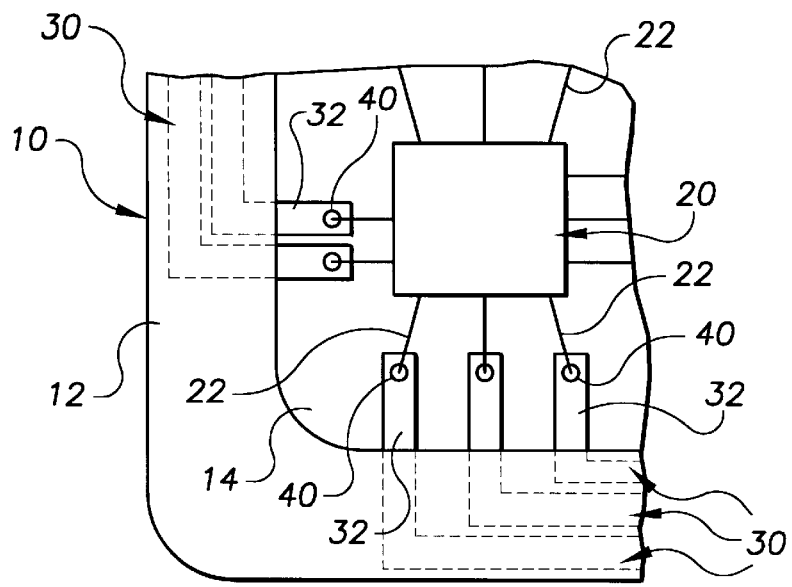
FIG. 1 is a partial view of an electrical device having conductive leads bonded to corresponding wire bond pads of a device package.

FIG. 1 illustrates a an electrical circuit device package 10 generally comprising an insulating member 12 having one or more electrical device accommodating portions, which are in the exemplary form of recessed cavities or openings 14 formed in the insulating member, for accommodating electrical circuit devices 20, for example semiconductor dice.

The device package 10 also comprises one or more conductors 30 of a first electrically conductive material embedded in the insulating member 12, and in one preferred embodiment the conductors 30 are insert molded into the insulating member, which is formed of a plastic or some other moldable material suitable for circuit device packaging applications.

In FIG. 1, portions 32 of the one or more conductors 30 protrude from the insulating member 12 into the circuit device accommodating portion 14 thereof for coupling to corresponding electrical leads or conductors 22 of the circuit device 20, as discussed below.

The conductors 30 and particularly the portions 32 thereof protruding into the device accommodating portion of the device package 10 include corresponding openings each having a conducting member 40 of a second electrically conductive material disposed therein and in electrical contact therewith. The conducting members 40 thus form the wire bond pads to which the electrical leads 22 from the circuit device 20 are electrically coupled, for example by ultrasonic bonding and other processes know to those of ordinary skill in the art.

In one embodiment, the opening is a hole extending through conductor portion 32, and the conducting member 40 is a generally cylindrical stud or blank disposed therein and electrically coupled thereto, for example by a stamping or some other operation, as discussed more fully below.

In one embodiment, the conductor 30 and the portion 32 thereof protruding into the device accommodating recess is copper alloy and the conducting member 40 that forms the wire bond pad is aluminum. In alternative embodiments, the conductor 30 and the conducting member 40 are formed of other conducting materials.

Figure 2:
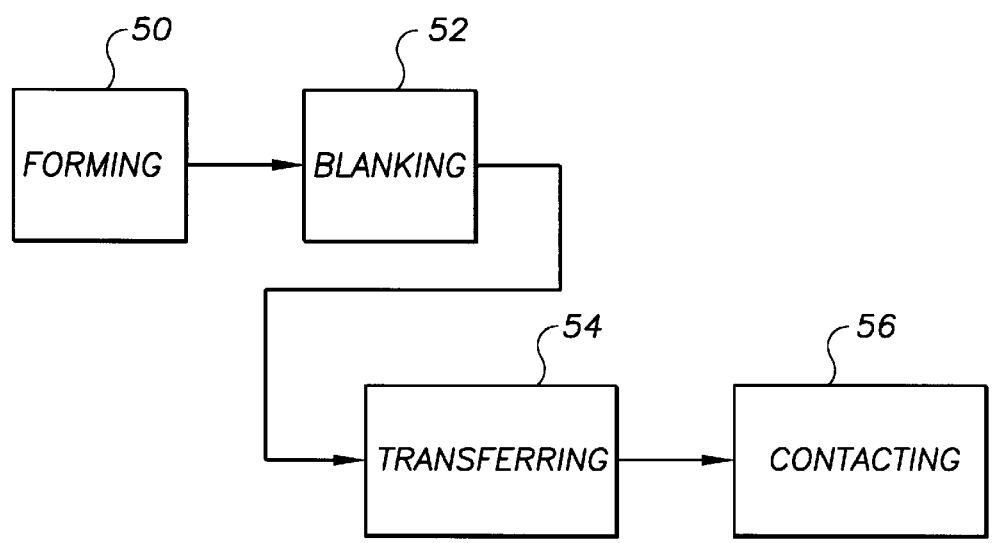
FIG. 2 is a process flow diagram for forming a wire bond pad on a conductor.

FIG. 2 is a process flow diagram for forming a wire bond pad on a conductor comprising generally forming an opening in a conductor of a first electrically conductive material in a forming operation 50, forming a conducting member in a blanking operation 52, transferring the conducting member into the opening in a transferring operation 54, and electrically contacting the conductor and conducting member in a contacting operation 56. Although these various operations are illustrated in the flow diagram as being performed separately, one more of the operations may be performed simultaneously.

Figure 3:
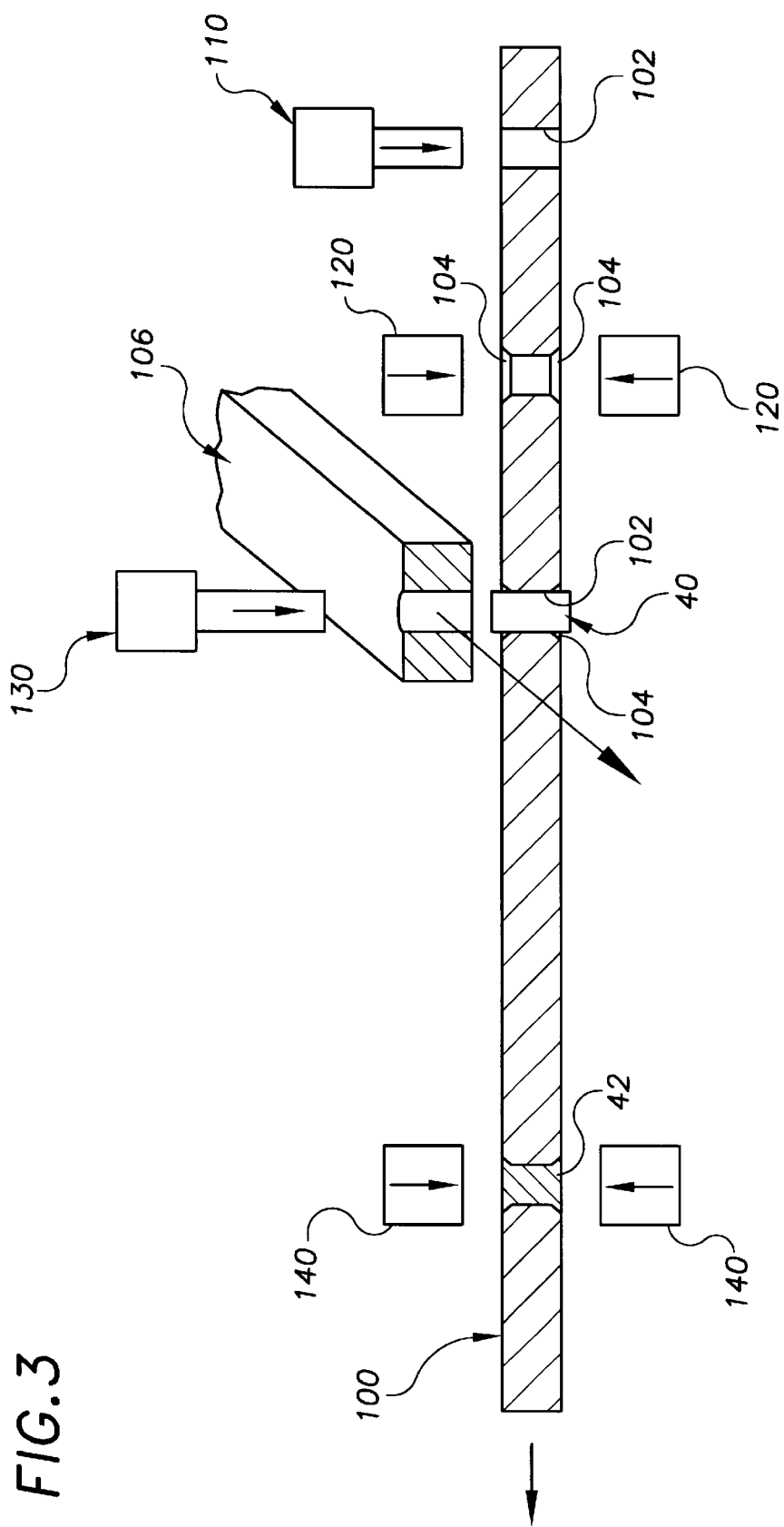
FIG. 3 is a schematic diagram for forming a wire bond pad on a conductor.

In FIG. 3, the opening is formed in the conductor, for example a copper strip 100, by punching a hole 102 therethrough with a hole forming punch 110. The opening may be formed alternatively by some other operation, for example a drilling or milling operation, and need not extend fully through the conductor. The conductor strip 100 is generally moved in a feed direction to and from the punch 110 or other opening forming station.

In some embodiments, a bevel 104 is formed about the opening 102 on one or both sides of the conductor strip 100. The bevels 104 may be formed by the punch 110 during the hole forming operation, or thereafter by dedicated bevel forming machinery 120, for example in a stamping or drilling or milling operation.

In FIG. 3, the conducting member 40 is formed from a second conductor 106, for example an aluminum strip, that is fed generally non-parallel to the feed direction of the conductor strip 100. In the exemplary embodiment, the conducting member 40 is formed as a blank or slug with a blanking punch 130. In the one preferred embodiment, the blank 40 is transferred into the opening 102 by the blanking punch 130 as the blank 40 is formed.

The transferring of the blank 40 by the blanking punch 130 also forms the electrical contact between the blank 40 and the conductor 100. In some alternative modes of manufacture, the blank 40 is subject to further stamping or other operations which further improves the electrical contact with the conductor.

In the exemplary embodiment wherein the hole 102 includes the one or more bevels 104, the axial dimension of the blank 40 is greater than that of the opening 102 so that the blank protrudes from the sides of the conductor 100 having the bevels 104, as illustrated in FIG. 3. Thereafter, the one or more portions of the blank 40 protruding from the opposite sides of the conductor are stamped by a flattening punch 140, which flattens or reduces the blank toward the surface level of the conductor, thus filling the beveled portion 104 of the conductor with the material of the conducting member or blank.

The flattening of the protruding portions of the conducting member or blank 40 and the resulting configuration thereof increases the contact surface area between the flattened blank 42 and the conductor 100, and also provides increased wire bond pad surface area for a given amount of blank conductor material, thereby more efficiently utilizing the material that forms the wire bond pad.

In another alternative operation, the conductor strip 100 with the conducting members 40 may be subject to a rolling operation, either instead of or after the flattening operation. The rolling operation however is not required, although it may be desirable for some conductor applications where further reduction in strip thickness and/or more robust electrical contact between the blanks and the conductor are required.

The conductor strip and particularly the flattened conductor members 42 thereof are preferably polished in a polishing operation, and are cut into individual conductors suitably sized for embedding into device packages, as illustrated generally in FIG. 1.

While the foregoing written description of the invention enables one of ordinary skill to make and use what is considered presently to be the best mode thereof, those of ordinary skill will understand and appreciate the existence of variations, combinations, and equivalents of the specific exemplary embodiments herein. The invention is therefore to be limited not by the exemplary embodiments herein, but by all embodiments within the scope and spirit of the appended claims.

What is claimed is:

1. A method for forming a wire bond pad on a conductor in an electrical circuit device package, comprising:
   forming an opening in a conductor of a first electrically conductive material;
   transferring a conducting member of a second electrically conductive material into the opening of the conductor, wherein the conducting member of the second electrically conductive material is formed while transferring the conducting member into the opening; and
   electrically contacting the conducting member with the conductor.

2. The method of claim 1, forming the opening by punching a hole through the conductor, and forming the conducting member as a blank with a punch.

3. The method of claim 2, transferring the blank into the hole through the conductor with the punch while forming the blank.

4. The method of claim 1, forming a bevel about the opening in the conductor before transferring the conducting member, forming a portion of the conducting member into bevel.

5. The method of claim 1, the first electrically conductive material is copper, the second electrically conductive material is aluminum, forming the opening by punching a hole through the conductor, forming a bevel about the hole on opposite sides of the conductor, forming a portion of the conducting member into bevel.

6. The method of claim 5, forming the conducting member with a punch, transferring the conducting member into the opening of the conductor with the punch while forming the conducting member.

7. The method of claim 1, insert molding the conductor with the conducting member in the opening thereof in an electrical circuit device package.

8. A method for a wire bond pad on a conductor for an electrical circuit device package, comprising:
   forming an opening in a conductor of a first electrically conductive material;
   transferring a conducting member of a second electrically conductive material into the opening of the conductor;
   electrically contacting the conducting member with the conductor while transferring the conducting member in to the opening of the conductor.

9. The method of claim 8, forming the conducting member of the second electrically conductive material while transferring the conducting member into the opening.

10. The method of claim 8, forming the opening by punching a hole through the conductor, forming a bevel about the hole on at least one side of the conductor before transferring the conducting member, a portion of the conducting member protruding from the side of the conductor having the bevel after transferring the conducting member, stamping the portion of the conducting member protruding from the conductor.

11. The method of claim 8, insert molding the conductor with the conducting member in the opening thereof in an electrical circuit device package.

12. A method for making a conductor with a wire bond pad for an electrical circuit device package, comprising:
   forming a conductive blank from a second electrically conductive material with a blanking punch;

transferring the conductive blank into an opening of a conductor of a first conductive material different than the second conductive material, with the blanking punch, the conductive blank electrically coupled to the conductor.

13. A method for forming a wire bond pad on a conductor in an electrical circuit device package, comprising:

forming an opening in a conductor of a first electrically conductive material by punching a hole in the conductor;

forming a bevel about the hole in the conductor on at least one side of the conductor;

transferring a conducting member of a second electrically conductive material into the hole of the conductor, such that a portion of the conducting member protrudes from the side of the conductor having the bevel;

stamping the portion of the conducting member protruding from the conductor; and electrically contacting the conducting member with the conductor.

14. A method for forming a wire bond pad on a conductor in an electrical circuit device package, comprising:

forming an opening in a conductor of a first electrically conductive copper material by punching a hole in the conductor;

forming a bevel about the hole in the conductor on opposite sides of the conductor;

transferring a conducting member of a second electrically conductive aluminum material into the hole of the conductor, such that a portion of the conducting member is formed into the bevel; and electrically contacting the conducting member with the conductor.

15. A method for forming a wire bond pad on a conductor in an electrical circuit device package, comprising:

providing an insulating member having an electrical device accommodating portion;

embedding a conductor of a first electrically conductive material in the insulating member, such that a portion of the conductor extends from the insulating member into the device accommodating portion thereof;

forming an opening in the portion of the conductor extending into the device accommodating portion;

forming a bevel about the opening in the conductor on at least one side of the conductor;

transferring a conducting member of a second electrically conductive material into the opening of the conductor, such that a portion of the conducting member protrudes from the side of the conductor having the bevel, wherein the conducting member of the second electrically conductive material is formed while transferring the conducting member into the opening;

forming the portion of the conducting member protruding from the conductor into the bevel; and electrically contacting the conducting member with the conductor.

* * * * *